United States Patent [19]

Kaneko

[11] Patent Number: 5,396,462
[45] Date of Patent: Mar. 7, 1995

[54] SEMICONDUCTOR MEMORY DEVICE HAVING A DATA-LINES CLAMP CIRCUIT

[75] Inventor: Tomoyuki Kaneko, Tokyo, Japan

[73] Assignee: NEC Corporation, Tokyo, Japan

[21] Appl. No.: 102,259

[22] Filed: Aug. 5, 1993

[30] Foreign Application Priority Data

Aug. 6, 1992 [JP] Japan .................. 4-209911

[51] Int. Cl.6 .................. G11C 11/416; G11C 11/36
[52] U.S. Cl. .................. 365/189.06; 365/190; 365/207; 365/208; 365/243
[58] Field of Search .................. 365/189.06, 190, 207, 365/208, 243

[56] References Cited

PUBLICATIONS

Abstract of Japanese Provisional Publication No. 63-259890, Oct. 1988.
Abstract of Japanese Provisional Publication No. 2-91886, Mar. 1990.

Primary Examiner—Eugene R. LaRoche
Assistant Examiner—F. Niranjan
Attorney, Agent, or Firm—Sughrue, Mion, Zinn, Macpeak & Seas

[57] ABSTRACT

Diodes are connected between a clamp control line and respective one of data lines. A voltage of the clamp control line in a read operation is set to a value higher, by a forward voltage of the diodes or less, than a lower value among the voltages of the data line to which a selected digit line is connected. The voltages of the data lines to which only non-selected digit lines are connected are clamped to a predetermined value.

12 Claims, 4 Drawing Sheets

SEMICONDUCTOR MEMORY DEVICE HAVING A DATA-LINES CLAMP CIRCUIT

BACKGROUND OF THE INVENTION

1. Field of the Invention

The present invention relates to a semiconductor memory device, and more particularly to a semiconductor memory device having a plurality of pairs of data lines to each of which a plurality of pairs of digit lines are connected and a clamp circuit for clamping or setting the voltages of the data lines at a predetermined levels.

2. Description of Related Art

FIG. 1 shows a circuit diagram of a data read section in a conventional semiconductor memory device. In FIG. 3, a memory cell 4 comprises NMOS transistors 5 to 8 and resistors 9 and 10. The NMOS transistor 7 has a source connected to a low power-source voltage VS2, and a drain and a gate connected to a gate and a drain of the NMOS transistor 8, respectively. The NMOS transistor 8 has a source connected to the low power-source voltage VS2 and a drain and a gate connected to the gate and the drain of the NMOS transistor 7, respectively. The resistor 9 is connected between a second high power-source voltage Vcc2 and the drain of the NMOS transistor 7. The resistor 10 is connected between the second high power-source voltage Vcc2 and the drain of the NMOS transistor 8. The NMOS transistor 5 has a gate connected to a word line 109 and a source and a drain connected to a digit line 101 and the drain of the NMOS transistor 7. The NMOS transistor 6 has a gate connected to a word line 109 and a source and a drain connected to the digit line 102 and the drain of the NMOS transistor 8.

A digit line block la comprises a pair of digit lines 101 and 102, PMOS transistors 2, 3, 11, and 12, and a plurality of memory cells 4. The PMOS transistor 2 has a gate connected to a second low power-source voltage VS2 and a source connected to the second high power-source voltage Vcc2, and a drain connected to the digit line 101. The PMOS transistor 3 has a gate connected to the second low power-source voltage VS2, a source connected to the second high power-source voltage Vcc2, and a drain connected to the digit line 102. The PMOS transistor 11 has a gate connected to the digit selecting line 111 and a source and a drain connected to the digit line 101, and a first data line 103, respectively. The PMOS transistor 12 has a gate connected to the digit selecting line 111, and a source and a drain connected to a digit line 102 and a first data line 105. The memory cells 4 are connected to a word line 109 and the digit lines 101 and 102. The digit selecting lines 111 to 114 are used for selecting one of the digit line blocks la to 1d.

In a conventional memory semiconductor device, a plurality of word lines are provided and a plurality of memory cells are connected to a pair of digit lines. FIG. 1 shows, however, only a single memory cell connected to a single word line and a pair of digit lines for easy understanding.

Each of the digit line blocks 1b to 1d has the same arrangement as that of the digit line block 1a except the followings:

The gates of the PMOS transistors 11 and 12 of the digit line block 1b are connected to a digit selecting line 112. The gates of the PMOS transistors 11 and 12 of the digit line block 1c are connected to a digit selecting line 113, and the drains of the PMOS transistors 11 and 12 are connected to the first data lines 104 and 106, respectively. The gate of the PMOS transistor 11 of the digit line block 1d is connected to a digit selecting line 114, and the drains of the PMOS transistors 11 and 12 are connected to the first data lines 104 and 106, respectively.

The first data lines 103 and 105 transmit data read out from the memory cells within the digit line blocks 1a and 1b to second data lines 107 and 108, respectively. The first data lines 104 and 106 transmit data read out from the memory cells within the digit line blocks 1c and 1d to the second data lines 107 and 108, respectively.

The first data lines 103 and 105 are connected to the bases of the NPN transistors 13 and 14, respectively. A collector of the NPN transistor 13 is connected to a first high power-source voltage Vcc1 and an emitter of which is connected to the second data line 107. A collector of the NPN transistor 14 is connected to the first high power-source voltage Vcc1 and an emitter of which is connected to the second data line 108.

Similarly, the first data lines 104 and 106 are connected to the bases of the NPN transistors 15 and 16, respectively. A collector of the NPN transistor 15 is connected to the first high power-source voltage Vcc1 and an emitter of which is connected to the second data line 107. A collector of the NPN transistor 16 is connected to the first high power-source voltage Vcc1 and an emitter of which is connected to the second data line 108. The second data lines 107 and 108 transmit data transmitted from the first data lines 103 or 105, and 104 or 106 to a sense amplifier SA.

The PMOS transistors 35 to 38 clamp or set the non-selected first data lines at a predetermined voltage in accordance with voltage values of block selecting lines 115 and 116. The gate of the PMOS transistor 35 is connected to the block selecting line 115. One of the remaining two terminals of the PMOS transistor 35 is connected to a clamp control line 110 and the other is connected to the first data line 103. The gate of the PMOS transistor 36 is connected to the block selecting line 115 and one of the remaining two terminals is connected to the clamp control line 110 and the other is connected to the first data line 105.

The gate of the PMOS transistors 37 is connected to the block selecting line 116. One of the remaining two terminals of the PMOS transistor 37 is connected to the clamp control line 110 and the other is connected to the first data line 104. A gate of the PMOS transistor 38 is connected to the block selecting line 116. One of the remaining two terminals of the PMOS transistor 38 is connected to the clamp control line 110 and the other is connected to the first data line 106.

The second data lines 107 and 108 are connected to the bases of NPN transistors 21 and 22 serving as input transistors of the sense amplifier SA. The collectors of the NPN transistors 21 and 22 are connected to the first high power-source voltage Vcc1. Further, the emitters of the NPN transistors 21 and 22 are connected to the drains of the NMOS transistors 27 and 29, respectively. The emitters of the NPN transistors 23 and 24 are connected to the drain of the NMOS transistor 28. The collector of the NPN transistor 23 is connected to the first high power-source voltage Vcc1 through a resistor 25 and a base of which is connected to the emitter of the NPN transistor 21. The collector of the NPN transistor 24 is connected to the first high power-source voltage Vcc1 through a resistor 26 and a base of which is connected to the emitter of the NPN transistor 22. A node of the resistor 25 and the collector of the NPN transistor 23 and a node of the resistor 26 and the collector of the NPN transistor 24 serve as sense outputs 201 and 202, respectively. The gates of the NMOS transistors 27 to 29 are connected to a reference voltage Vr and sources of which are connected to a first low power-source voltage Vs1.

A read operation of the memory circuit shown in FIG. 1 will now be described. Assume now that the memory cell 4 in the digit line block 1a is in a selected state and the NMOS transistor 7 is in an ON state.

A decoder (a column decoder) not shown sets one of the digit selecting lines 111 to 114 to a low level and the remaining three lines to a high level in response to an externally supplied column address signal.

Similarly, a decoder (a row decoder) not shown selects one of plurality of word lines, sets the selected word line and non-selected word lines to high and low levels, respectively in response to an externally supplied row address signal. Assume now that the word line 109 is in the selected state and in the high level state.

In the memory cell 4 of the selected digit line block 1a, the NMOS transistor 7 is in the ON state; the NMOS transistor 8 is in the OFF state; and the memory cell 4 is in a stable state.

The voltages of the digit lines 101 and 102 are determined by the currents flowing into the first data lines 103 and 105, and the current flowing into the memory cell 4.

The voltages of the first data lines 103 and 105 are transmitted to the second data lines 107 and 108 through the NPN transistors 13 and 14 and applied to a sense amplifier SA using a differential operational amplifier.

If the PMOS transistors 35 to 38 are assumed not to be provided, the first data lines 104 and 105 in the non-selected state (to which the selected digit block selecting line 1a is not connected) goes to a floating state electrically and the voltages thereof becomes unstable.

If the voltages of the first data lines 104 and 106 become an abnormally low voltage due to some cause and the selected digit line block is switched from the digit line block 1a to the digit line block 1c or 1d, a time period for reading data from the memory cell will become longer or data might be erroneously written in the memory cell.

More specifically, when the voltages of the first data lines 104 and 106 become a voltage lower than the voltage of the data line 103 to which the selected digit line block 1a is connected by an intermediate voltage between the second high power-source voltage Vcc2 and the low power-source voltage Vs2 (or a voltage lower than the intermediate voltage), and when the selected digit line block 1a is switched to the digit line block 1c or 1d, the read time might be longer since it takes too much time to charge the first data lines 104 and 106 or the voltages of the first data lines 104 and 106 may change the voltages of the newly selected digit lines 101 and 102 so that the data might be erroneously written in the memory cell. The voltage of the data line 103 is a lower-side one of the voltages of the first data lines 103 and 105 to which the selected digit line block 1a is connected. The voltage of the data line 103 is lower than the second high power source Vcc2 by 0.1 V to 0.2 V.

In order to prevent such problem, in the semiconductor memory device shown in FIG. 1, clamping transistors 35 to 38 are provided. The voltage of the clamp control line 110 is set at a voltage equal to or slightly lower than a voltage of the line at the low voltage side of the first data lines 103 and 105 to which the selected digit line block 1a is connected; the block selecting line 115 is set at a high level and the PMOS transistors 35 and 36 are cut off to electrically isolate the first data lines 103 and 105, and the clamp control line 110. Further, the block selecting line 116 is set at a high level and the PMOS transistors 37 and 38 are turned on to clamp the voltages of the first data lines 104 and 106 at the one approximately equal to the voltage of the clamp control line 110. Such arrangement permits the voltages of the first data lines 104 and 106 in the non-selected state to be fixed without affecting the voltages of the first data lines 103 and 105 in the selected state.

However, in the semiconductor memory device having the above arrangement, the block selecting lines 115 and 116, a circuit for identifying the selected and non-selected states of the data line pairs, a circuit for controlling the voltages of the block selecting lines and the like must be provided, resulting in increased circuit size and complicated circuit structure.

SUMMARY OF THE INVENTION

The present invention has been developed in view of the above drawbacks and its object is to provide a semiconductor memory device which can clamp the voltage of the non-selected data lines at a predetermined value with a simple arrangement.

In order to achieve the above object, according to a first aspect of the present invention, a semiconductor memory device comprises: a plurality of pairs of digit lines (101, 102), each digit line pair being coupled to a plurality of memory cells (4), and transmitting read out signals of a selected memory cell; at least two pairs of data lines (103 to 106), each data line pair being provided for every plurality of pairs of digit line pairs; selecting means (11, 12, 111 to 113) coupled to the plurality of pairs of digit lines and the at least two pairs of data lines, for transmitting signals on the selected digit lines to corresponding data line pair; and a sense amplifier means (13 to 16, 107, 108, SA), coupled to the plurality of data line pairs, for detecting and outputting a voltage of the data lines to which the signals on the selected digit lines are transmitted, and clamping means (17 to 18, 110) comprised of diodes, anodes of which receive a predetermined clamp reference voltage and each cathode of which is coupled to a corresponding one of the data lines, for clamping the voltages of the data lines corresponding to only the non-selected data lines at a predetermined value.

According to a second aspect of the present invention, a semiconductor memory device comprises: a plurality of pairs of digit lines (101, 102), each digit line pair being coupled to a plurality of memory cells (4), and transmitting read out signals of a selected memory cell; at least two pairs of data lines (103 to 106), each data line pair being provided for every plurality of pairs of digit line pairs; selecting means (11, 12, 111 to 113) coupled to the plurality of pairs of digit lines and the at least two pairs of data lines, for transmitting signals on the selected digit lines to corresponding data line pair; and a sense amplifier means (13 to 16, 107, 108, SA), coupled to the plurality of data line pairs, for detecting and outputting voltages of the data lines to which the signals on the selected digit lines are transmitted, and clamping means (31 to 34, 110) comprised of bipolar transistors bases of which receive a predetermined clamp reference voltage, each of emitters of which is coupled to a corresponding one of the data lines, and a collector of which receives a predetermined voltage, for clamping the voltages of the data lines corresponding to only the non-selected data lines at a predetermined value.

According to the above arrangement, the voltage of the data lines in the non-selected state (to which the selected digit lines are not connected) are clamped at a desired value by the diodes or the bipolar transistors.

DETAILED DESCRIPTION OF THE PREFERRED EMBODIMENTS

Figure 1:
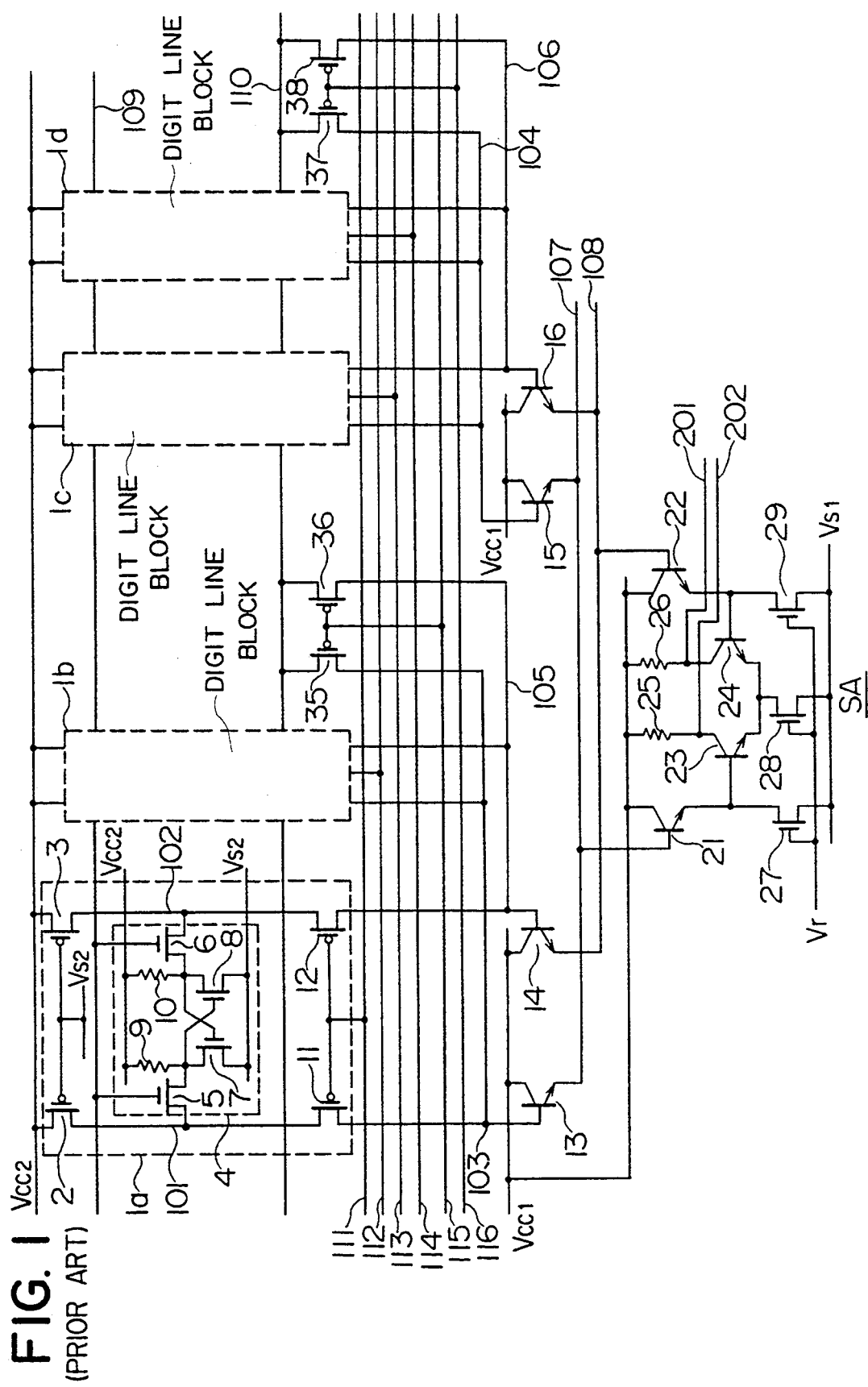
FIG. 1 is circuit diagram of a conventional semiconductor memory device.

An embodiment of the present invention will now be described with reference to the drawings. Note that in FIGS. 2 to 5, the same reference numerals are used for the same parts as in FIG. 1.

A first embodiment of the present invention will be described with reference to FIG. 2 to 4.

Figure 2:
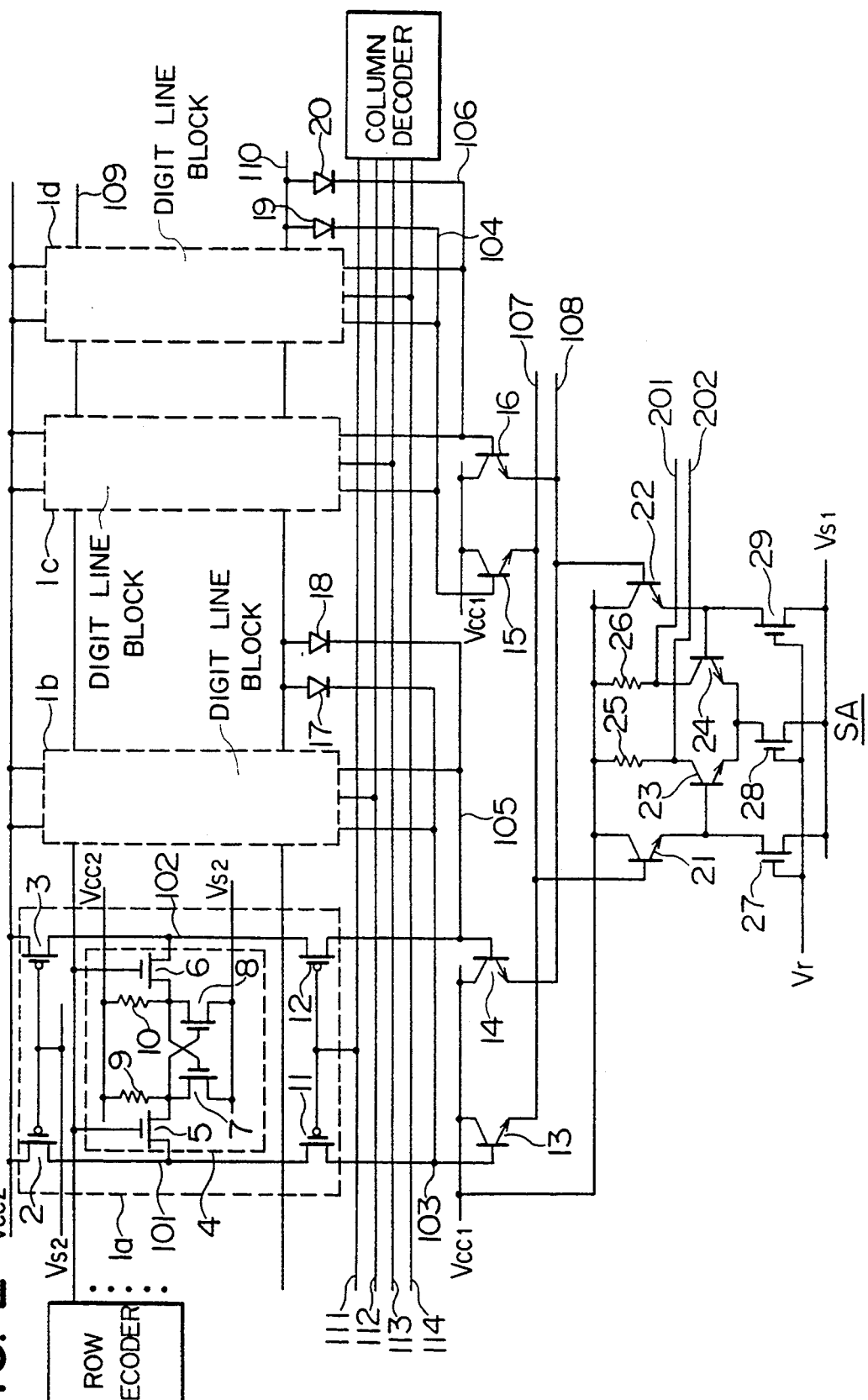
FIG. 2 is a circuit diagram of a semiconductor memory device according to a first embodiment of the present invention.

In FIG. 2, the memory cell 4 comprises NMOS transistors 5 to 8 and resistors 9 and 10. A source of the NMOS transistor 7 is connected to a low power-source voltage Vs2 and a drain and a gate of which are connected to a gate and a drain of the NMOS transistor 8. A source of the NMOS transistor 8 is connected to the low power-source voltage Vs2 and a drain and a gate of which are connected to the gate and the drain of the NMOS transistor 7. The resistor 9 is connected between a second high power-source voltage Vcc2 and a drain of the NMOS transistor 7. The resistor 10 is connected between the second high power-source voltage Vcc2 and the drain of the NMOS transistor 8. The gate of the NMOS transistor 7 is connected to a word line 109 and the remaining two terminals of which are connected the drain of the NMOS transistor 7 and a digit line 101, respectively. A gate of the NMOS transistor 106 is connected to the word line 109 and the remaining two terminals of which are connected to the drain of the NMOS transistor 8 and a digit line 102.

The digit line block 1a comprises a pair of digit lines 101 and 102, PMOS transistors 2, 3, 11, and 12, and a plurality of memory cells 4. A gate of the PMOS transistor 2 is connected to the second low power-source voltage Vs2, a source of which is connected to the second high power-source voltage Vcc2, and a drain of which is connected to the digit line 101. A gate of the PMOS transistor 3 is connected to the second low power-source voltage Vs2, a source of which is connected to the second high power-source voltage Vcc2 and a drain of which is connected to the digit line 102. A gate of the PMOS transistor 11 is connected to the digit selecting line 111, and the remaining two terminals are connected to the digit line 101 and the first data line 103. A gate of the PMOS transistor 12 is connected to the digit line 111 and the remaining two terminals are connected to the digit line 102 and the first data line 105. The memory cell 4 is connected to the word lines 109 and the digit lines 101 and 102. The digit selecting lines 111 to 114 are used for selecting one of the digit line blocks 1a to 1d.

Figure 3:
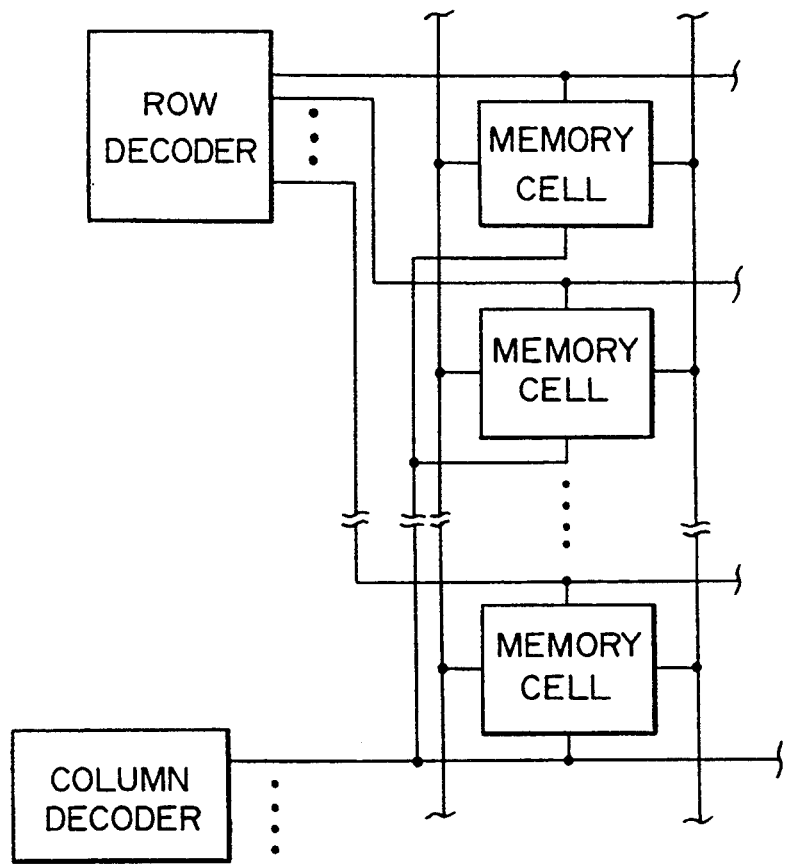
FIG. 3 is a circuit diagram of a digit line block.

In an actual semiconductor memory device, a plurality of word lines are provided and a plurality of memory cells are connected to a digit line pair, as shown in FIG. 3. However, a single memory cell 4 connected to a single word line 109 and a pair of digit lines 101 and 102 is shown in FIG. 2 in order for the easy understanding.

Each of Digit line blocks 1b to 1d has the same arrangement as the digit line block 1a except the followings. The gates of the PMOS transistors 11 and 12 of the digit line block 1b are connected to the digit selecting line 112. The gates of the PMOS transistors 11 and 12 of the digit line block 1c are connected to the digit selecting line 113, and the drains of the PMOS transistors 11 and 12 are connected to the first data lines 104 and 106, respectively. The gates of the PMOS transistors 11 and 12 of the digit line block 1d are connected to the digit selecting line 114 and the drains of the PMOS transistors 11 and 12 are connected to the first data lines 104 and 106, respectively.

The first data lines 103 and 105 transmit the data output from the memory cell 4 within the digit line blocks 1a and 1b to second data lines 107 and 108 to be described later. The first data lines 104 and 106 transmit the data read out from the memory cell 4 within the digit line blocks 1c and 1d to the second data lines 107 and 108.

The first data lines 103 and 105 are connected to the bases of the NPN transistors 13 and 14, respectively. A collector of the NPN transistor 13 is connected to a first high power-source voltage Vcc1 and an emitter thereof is connected to the second data line 107. A collector of the NPN transistor 14 is connected to the first high power-source voltage Vcc1 and an emitter thereof is connected to the second data line 108.

Similarly, the first data lines 104 and 106 are connected to the bases of the NPN transistors 15 and 16. A collector of the NPN transistor 15 is connected to the first high power-source voltage Vcc1 and an emitter thereof is connected to the second data line 107. A collector of the NPN transistor 16 is connected to the first high power-source voltage Vcc1 and an emitter thereof is connected to the second data line 108.

The second data lines 107 and 108 transmit data from the first data lines 103 or 105, and 104 or 106 to the sense amplifier SA.

A clamp circuit for clamping the voltages of the non-selected data lines at a predetermined value comprises diodes 17 to 20. Anodes of the diodes 17 and 18 are connected to the clamp control line 110 and the cathodes thereof are connected to the corresponding first data lines 103 and 105, respectively. Similarly, the anodes of the diodes 19 and 20 are connected to the clamp control line 110 and the cathodes thereof are connected to the first data lines 104 and 106, respectively.

A read operation of the above embodiment will now be described. Assume now that the memory cell 4 of the digit line block 1a is in the selected state and the NMOS transistor 7 is ON.

The digit selecting lines 111 to 114 are signal lines for selecting one of the digit line blocks 1a to 1d. A column decoder sets one of the digit selecting lines 111 to 114 to a voltage (referred to as a low level) equal to or lower than the second low power-source voltage Vs2, and the remaining three digit selecting lines to a voltage (referred to as a high level) equal to or approximately equal to the second high power-source voltage Vcc2. The first high power-source voltage Vcc1 is higher than the first low power-source voltage Vs1; the second high power-source voltage Vcc2 is equal to or lower than the first high power-source voltage Vcc1; and the second low power-source voltage Vs2 is equal to or higher than the first low power-source voltage Vs1 and lower than the second high power-source voltage Vcc2.

The row decoder sets a voltage of the selected one of the word lines at a high level and a voltage of the non-selected word lines to a low level in response to an externally supplied row address. The word line 109 in FIG. 2 is assumed to be in the selected state and at the high level.

The NMOS transistor 7 in the memory cell 4 of the selected digit line block 1a is now ON. For this reason, a read current flows from the second high-voltage power-source voltage Vcc2 to the second low power-source voltage Vs2 through the PMOS transistor 2 serving as the digit line load, the digit line 101 and the NMOS transistors 5 and 7. The values of the resistors 9 and 10 are set to $10^6$ to $10^{12}$ ohms in order to make a holding current of the memory cell 4 small. For this reason, the drain of the NMOS transistor 7 goes low and the NMOS transistor 8 is cut off since the gate of which goes low. For this reason, the current seldom flows into the resistor 10 and the NMOS transistor 6 so that the gate of the NMOS transistor 7 goes high and the memory cell 4 is in the stable state.

The voltages of the digit lines 101 and 102 are determined by a ratio of the current flowing into the first data lines 103 and 105 through the NMOS transistors 11 and 12 serving as the digit line selector, to the current flowing into the memory cell 4. The current flowing from the digit line 101 to the first data line 103 is approximately equal to the current flowing from the digit line 102 into the first data line 105. Normally, in order to reduce the read time, the three MOS transistors into which the read current flows are designed such that the voltage difference between the digit lines 101 and 102 is within a range of 50 to 100 mV.

The currents flowing from the first digit lines 101 and 102 into the first data lines 103 and 105 are not required in the stable state, and therefore set to a small value in order to reduce the dissipated power. Further, a voltage drop of several tens of millivolts is caused in the PMOS transistor 3 serving as the digit line into which no read current flows.

The voltages of the digit lines 101 and 102 are transmitted to the first data lines 103 and 105 through the PMOS transistors 11 and 12. The voltages of the first data lines 103 and 105 are transmitted to the second data lines 107 and 108 through the NPN transistors 13 and 14 and applied to the sense amplifier SA using a differential amplifier.

The NPN transistors 21, 22 and NMOS transistors 27 and 29 form an input level shift circuit of the sense amplifier SA. The NPN transistors 23, 24, resistors 25, 26, and the NMOS transistor 28 form the differential amplifier. The voltages input from the input level shift circuit are amplified by the differential amplifier and output as the sense outputs 201 and 202.

On other hand, in order to prevent the non-selected first data lines from being in the electrical floating state and the voltages thereof being indeterminate, according to the semiconductor memory device of the present invention, the clamp control line 110 and the diodes 17 to 20 are provided.

The voltage of the clamp control line 110 in the read operation is set, by an amount of the forward voltage or less of the diodes 17 to 20, higher than the lower one of the voltages of the selected first data line pair. The lower one of the voltages of the selected first data line pair in the normal read operation is lower than the second high power-source voltage Vcc2 by 0.1 through 0.2 V, for example. When the diodes 17 to 20 comprise silicon NPN bipolar transistors the collectors and bases of which are shortcircuited, the forward voltage of the diodes 17 to 20 is approximately 0.7 through 0.8 V.

In this embodiment, the selected first data lines means the first data lines to which the selected digit line block is connected, and the non-selected first data lines means first data lines to which only the non-selected digit line blocks are connected. The selected first data lines comprises first data lines 103 and 105 and the non-selected first data lines comprises first data lines 104 and 106. The first data line 103 has a lower voltage than that of the first data line 105. The voltage of the clamp control line 110 in the read operation is set higher than the voltage of the first data line 103 by any amount of the forward voltage or less of the diodes 17 to 20.

The voltages of the non-selected first data lines 104 and 106 are clamped by the diodes 19 and 20 and are lower than that of the clamp control line 110 by the amount of the forward voltage of the diodes 19 and 20. The voltage of the data line 103 having the lower voltage among the voltages of the selected data line pair 103 and 105 is not affected by the clamp control line 110 and the diode 17, because the voltage of the clamp control line 110 is set, in advance, higher than the voltage of the first data line 103 by the amount of the forward voltage or less of the diode 17 in order to avoid the effect of the clamp control line 110 on the voltage of the first data line having the lower voltage. The first data line 105 having the higher voltage is also not affected by the clamp control line 110 and the diode 18, since the voltage of the first data line 105 is higher than that of the first data line 103 having the lower voltage, and the forward potential difference of the diode 18 becomes smaller than that of the diode 17.

As described in the background of the invention, when the non-selected first data lines become the electrical floating state, the data read operation may be delayed or the data may be erroneously written in the memory. The provision of the diodes 17 to 20 and the setting of the voltage of the clamp control line 110 to the above described predetermined value will permit the voltages of the non-selected first data lines to be clamped at the lower value of the voltages of the selected first data line pair or a value smaller than the lower value. Therefore, the memory cell can be prevented from the erroneous operation.

As described above, according to the semiconductor memory device of the first embodiment, the clamp control line 110 and the diodes 17 to 20 are provided and the voltage of the clamp control line 110 in the read operation is set to the above described value. Accordingly, and the voltages of the non-selected first data lines can be clamped at a predetermined value without providing a complicated circuit for controlling the clamping element. Accordingly, the circuit arrangement can be simplified and the dissipated power can be reduced.

According to the above arrangement, the voltages of the first data lines 103 to 106 are approximately identical independent of the selected or non-selected state. For this reason, even if the digit line block connected to the non-selected first data line is selected, the voltages at the second data lines or at the input terminals of the sense amplifier change minimally. For this reason, the read operation is delayed minimally.

An arrangement and operation of the data write portion in the semiconductor memory device according to the embodiment will now be described.

The data write portion in the semiconductor memory device according to the present embodiment can be arranged in the following two methods.

(i) Besides the digit line pairs (a read digit line pairs) shown in FIG. 2, write digit line pairs and a circuit for selecting one of the digit line pairs are provided. In a write operation, all the read digit lines are set to the non-selected state and one write digit line pair is selected. The selected write digit lines are set at predetermined voltages corresponding to write data. This arrangement will prevent the delay of the read operation and the erroneous write operation in the newly selected memory cell. However, this method increases the size of the circuit, resulting in a complicated circuit arrangement.

(ii) In the write operation, a write circuit not shown sets the voltages of the digit lines 101 and 102 of the digit line block selected in response to the write data. The voltage of the clamp control line 110 is reduced to such a value as the write operation is not affected. After the completion of the write operation, the voltage of the data line the voltage of which is reduced is resumed to a predetermined level. This arrangement will raise the voltages of the first data lines in the read operation so that the delay of the read operation and the erroneous writing into the newly selected memory cell can be prevented.

Figure 4:
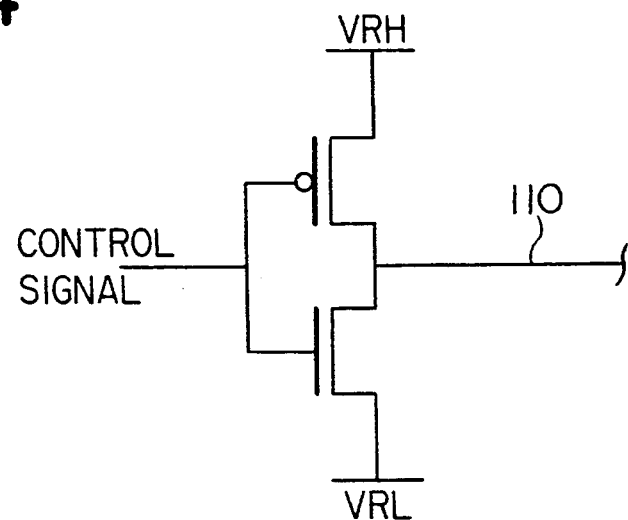
FIG. 4 is a block diagram showing an arrangement of a clamp voltage generation circuit.

FIG. 4 shows an example of a voltage setting circuit using a CMOS inverter, for setting a voltage of the clamp control line 110. A high reference voltage VRH of the CMOS inverter is generated by decreasing the second high power-source voltage Vcc2, for example and is set at the voltage of the clamp control line 110 in the read operation. A low reference voltage VRL is generated by raising the second high power-source voltage Vs2, for example and set to the voltage of the clamp control line 110 in the write operation. An input terminal of the CMOS inverter receives a control signal which goes low and high in the read and write operations, respectively.

A second embodiment of the present invention will now be described.

Figure 5:
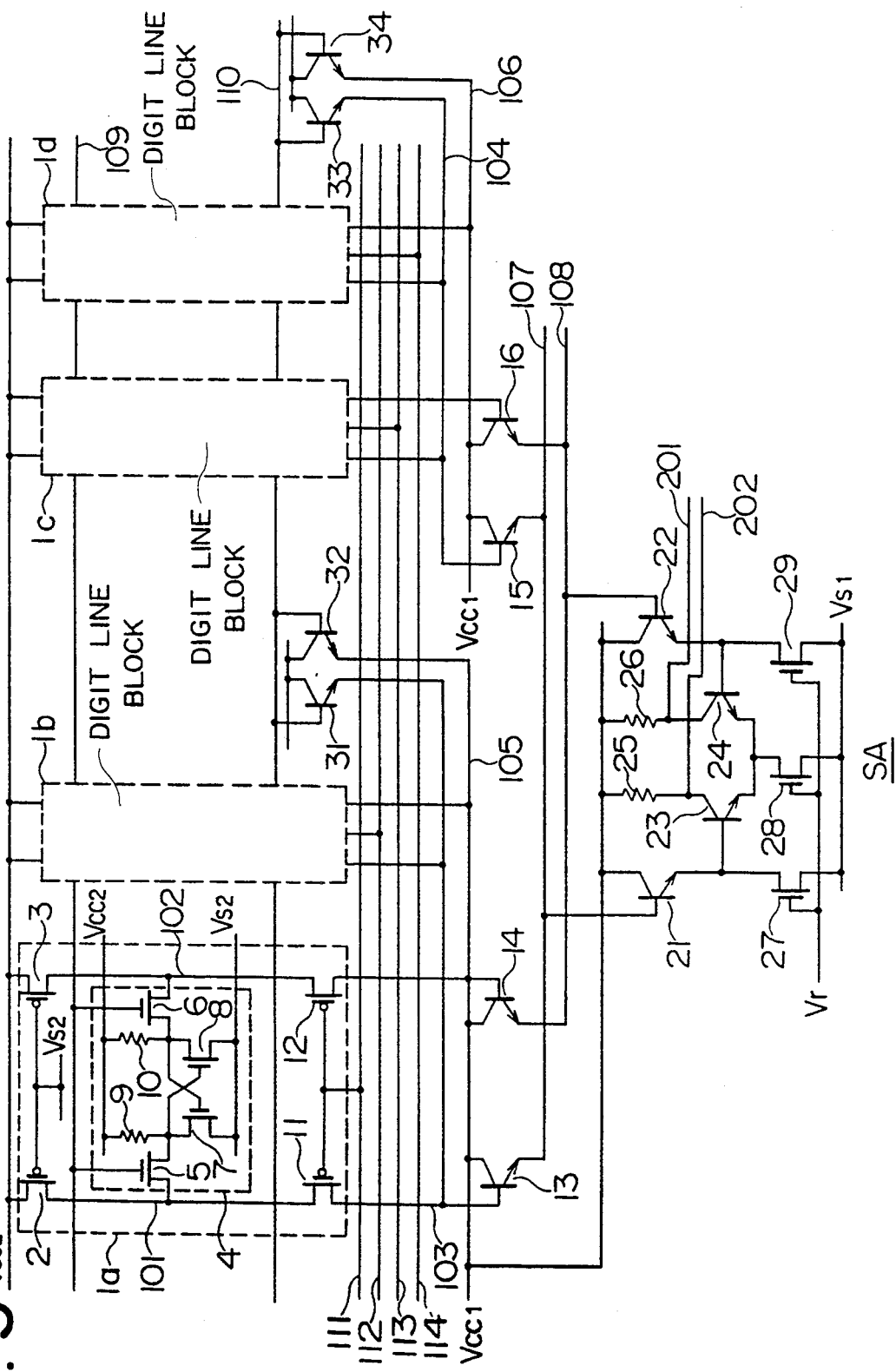
FIG. 5 is a circuit diagram of a semiconductor memory device according to a second embodiment of the present invention.

FIG. 5 illustrates a block diagram showing the second embodiment. As is apparent from the comparison of FIG. 5 with FIG. 2, this embodiment differs from the first embodiment in that NPN transistors 31 to 34 are used as the clamping element in place of the diodes 17 to 20.

The NPN transistor 31 has a collector connected to the first high power-source voltage Vcc1, a base connected to the clamp control line 110 and an emitter connected to the first data line 103. The NPN transistor 32 has a collector connected to the first high power-source voltage Vcc1, a base connected to the clamp control line 110 and an emitter connected to the first data line 105.

The NPN transistor 33 has a collector connected to the first high power-source voltage Vcc1, a base connected to the clamp control line 110 and an emitter connected to the first data line 106. The NPN transistor 34 has a collector connected to the first high power-source voltage Vcc1, a base connected to the clamp control line 110 and an emitter connected to the first data line 106.

The voltage of the clamp control line 110 in the read operation is set, by an amount to the base-emitter forward voltage or less of the NPN transistors 31 to 34, higher than the lower voltage of the first data line pair to which the selected digit line block is connected.

Note that the base-emitter forward voltage of the NPN transistors 31 to 34 is approximately 0.7 to 0.8 V in the case of the silicon NPN bipolar transistor, for example.

Similar to the assumption in FIG. 2, it is assumed that the memory cell 4 in the digit line block 1a is selected and the NMOS transistor is ON. The voltages of the first data lines 104 and 106 in the non-selected state are clamped by the NPN transistors 33 and 34 and are set lower than the voltage of the clamp control line 110 by the base-emitter forward voltage or less of the NPN transistors 33 and 34.

Among the selected first data lines 103 and 105, the voltage of the first data line 103 having the lower voltage is the voltage of the clamp control line 110 or more. For this reason, the NPN transistor 103 is turned off, and the voltage of the first data line 103 is not affected by the clamp control line 110 and the NPN transistor 31. The voltage of the first data line 105 having the higher voltage is higher than that of the clamp control line 110. Accordingly, the NPN transistor 32 is turned off and the voltage of the first data line 105 is not affected by the clamp control line 110 and the NPN transistor 32.

The above arrangement, like in the first embodiment, can selectively clamp only the voltage of the first data line which must be clamped without providing a complicated control circuit for controlling the clamp element.

When diodes are used as the clamp element, all the currents flowing into the first data lines when clamped, are supplied from the clamp control line 110. However, in the second embodiment, most of the currents flowing into the first data lines are supplied from the first high power-source voltage Vcc1 as the collector current. Thus, the current flowing from the clamp control line 110 can be set to 1/current amplification factor (normally 50 or more) of the current flowing into the first data line.

When a circuit controlling the voltage of the clamp control line 110 show in FIG. 4 is used, the clamp element comprises NPN transistors. Accordingly, the current flowing into the clamp control line is reduced. Therefore, a load of the circuit generating the clamp voltage can be reduced and the dissipated power of the generating circuit can also be reduced.

In the first and second embodiments, the voltages of the first data lines are clamped by using the clamping elements. However, the present invention is not limited to the above embodiments. For example, when a plurality of second data line pairs are provided, the voltages of the non-selected second data lines may be clamped by using the diodes or transistors. When third data line pairs to which the second data line pairs are connected are provided, the voltages of the third data lines may be clamped.

As has been described above, according to the present invention, only the voltage of the data line which is required to be clamped can be clamped without identifying the selected or non-selected state and providing a control circuit for controlling the clamp element. More specifically, the voltage of the data line can be clamped to a predetermined value with a comparatively simple and small-sized circuit. Accordingly, the dissipated power can be reduced.

Further, according to the present invention, the voltages of the data lines are approximately identical independent of the selected or non-selected state. Therefore, the change of the voltages of other data lines or at the input terminal of the sense amplifier is small. For this reason, the delay of the read operation is small.

In the write operation, when the voltage of the clamp control line is reduced to such a value so as not to affect the write operation, and is resumed to an original voltage in the read operation after completion of the write operation, the data line the voltage of which is reduced is clamped by the diodes or the bipolar transistors and resumed to the original voltage after the completion of the write operation. Accordingly, the delay of the read time or the erroneous writing into the newly selected memory cell can be prevented. Particularly, when the clamp element comprises bipolar transistors, the current flowing into the clamp control line is reduced, the load of the generator of the clamp voltage, and the dissipated power of the generator can be reduced. Further, the resuming time after the completion of the write operation can be shortened because of a large clamp current.

What is claimed is:

1. A semiconductor memory device, comprising:
   a plurality of digit line pairs, a plurality of cells being coupled to each digit line pair, each digit line pair transmitting read signals from a selected memory cell;
   at least two pairs of data lines, each data line pair being provided for every plurality of digit line pairs;
   selecting means coupled to the plurality of digit line pairs and the at least two pairs of data lines for receiving address signals and for selecting one of the digit line pairs in response to the address signals and transmitting signals on the selected digit line pair to a corresponding data line pair;
   sense amplifier means coupled to the plurality of data line pairs and for detecting and outputting voltages of the data line pairs to which the signals on the selected digit line pair are transmitted; and
   clamp means comprised of diodes, anodes of which receiving a predetermined clamp reference voltage, and each of the cathodes of which being coupled to a corresponding one of said data lines, for clamping voltages of the data lines corresponding to only non-selected digit line pairs at a predetermined voltage.

2. The device according to claim 1, wherein the clamp reference voltage is a voltage higher, by a forward voltage of the diode, than a lower value among voltages of the data line pair corresponding to the selected digit line pair.

3. The device according to claim 1, further comprising means for setting, in a read operation, the clamp reference voltage to a first voltage higher, by the forward voltage of the diode, than the lower one of voltages of the data line pair corresponding to the selected digit line pair, and for setting, in a write operation, the clamp reference voltage to a second voltage lower than the first voltage.

4. A semiconductor memory device, comprising:
   a plurality of digit line pairs, a plurality of memory cells being coupled to each digit line pair, each digit line pair transmitting read signals from selected memory cell;
   at least two pairs of data lines, each data line pair being provided for every plurality of digit line pairs;
   selecting means coupled to the plurality of digit line pairs and the at least two pairs of data lines for receiving address signals and for selecting one of the digit line pairs in response to the address signals and transmitting signals on the selected digit line pair to corresponding one of the data line pairs;
   sense amplifier means coupled to the plurality of data line pairs and for detecting and outputting voltages of the data line pairs to which the signals on the selected digit lines pair are transmitted; and
   clamp means comprised of bipolar transistors bases of which receiving a predetermined clamp reference voltage and emitters of which being coupled to corresponding one of the data lines, and collectors of which receiving a predetermined voltages, for clamping a voltages of the data lines corresponding to only non-selected digit line pairs to a predetermined voltage.

5. The device according to claim 4, wherein the clamp reference voltage is a voltage higher, by a base-emitter forward voltage of the transistor, than a lower voltage among voltages of the data line pair corresponding to the selected digit line pair.

6. The device according to claim 4, further comprising means for setting, in a read operation, the clamp reference voltage to a first voltage higher, by the base-emitter forward voltage of the transistor, than a lower voltage of the voltages of the data line pair corresponding to the selected digit line pair, and for setting, in a write operation, the clamp reference voltage to a second voltage lower than the first voltage.

7. A semiconductor memory device, comprising:
   a plurality of first digit line pairs, a plurality of memory cells being coupled to each of the first digit line pairs;
   a plurality of second digit line pairs, a plurality of memory cells being coupled to each of the second digit line pairs;
   a first data line pair;
   a second data line pair;
   switching means for selecting one of the first and second digit line pairs and for coupling the selected digit line pair to the first or second data line pair;
   means, coupled to the first and second data line pairs, for sensing, amplifying and outputting the signals on the first or second data line pair; and
   diodes, anodes of which receiving a predetermined clamp reference voltage and cathodes of which being coupled to the corresponding one of the first and second data lines.

8. The device according to claim 7, wherein the clamp reference voltage is a voltage higher, by a forward voltage of the diode, than a lower voltage among voltages of the data line pair which receives signals on the selected digit line pair through said switching means.

9. The device according to claim 7, further comprising means for setting, in a read operation, the clamp reference voltage to a first voltage higher, by the forward voltage of the diode, than the lower voltage of the voltages of the data line pair which receives signals on the selected digit line pair through the switching means, and for setting, in a write operation, the clamp reference voltage to a second voltage lower than the first voltage.

10. A semiconductor memory device, comprising:
a plurality of first digit line pairs, a plurality of memory cells being coupled to each of the first digit line pairs;
a plurality of second digit line pairs, a plurality of memory cells being coupled to each of the second digit line pairs;
a first data line pair;
a second data line pair;
switching means for selecting one of the first and second digit line pairs and for coupling the selected digit line pair to the first or second data line pair;
means, coupled to the first and second data line pairs, for sensing, amplifying, and outputting the signals on the first or second data line pair; and
clamp means comprised of bipolar transistors bases of which receiving a predetermined clamp reference voltage, each emitter being coupled to corresponding one of first and second data lines, and a collector of which receiving a predetermined voltage.

11. The device according to claim 10, wherein the clamp reference voltage is a voltage higher, by a base-emitter forward voltage of the transistors, than a lower voltage among voltages of the data line pair which receives signals on the selected digit line pair through the switch means.

12. The device according to claim 10, further comprising means for setting, in a read operation, the clamp reference voltage to a first voltage higher, by the base-emitter forward voltage of the transistors, than the lower voltage of the voltages of the data line pair which receives signals on the selected digit line pair, and for setting, in a write operation, the clamp reference voltage to a second voltage lower than the first voltage.

* * * * *

UNITED STATES PATENT AND TRADEMARK OFFICE
CERTIFICATE OF CORRECTION

PATENT NO.   : 5,396,462
DATED        : March 7, 1995
INVENTOR(S)  : Tomoyuki Kaneko It is certified that error(s) appears in the above-identified patent and that said Letters Patent is hereby corrected as shown below:

Column 1, Line 36, delete "la" and insert --1a--.

Column 3, line 13, delete "la" and insert --1a--.

Column 5, line 56, delete "la" and insert --1a--.

Signed and Sealed this

Twenty-second Day of August, 1995

Attest:

BRUCE LEHMAN

Attesting Officer    Commissioner of Patents and Trademarks